(12) United States Patent
Mikawa et al.

(10) Patent No.: US 8,609,059 B2
(45) Date of Patent: Dec. 17, 2013

(54) PRODUCTION METHOD, PRODUCTION VESSEL AND MEMBER FOR NITRIDE CRYSTAL

(75) Inventors: Yutaka Mikawa, Ibaraki (JP); Makiko Kiyomi, Ibaraki (JP); Yuji Kagamitani, Ibaraki (JP); Toru Ishiguro, Sendai (JP); Yoshihiko Yamamura, Muroran (JP)

(73) Assignees: Mitsubishi Chemical Corporation, Tokyo (JP); Tohoku University, Sendai-shi (JP); The Japan Steel Works, Ltd., Tokyo (JP)

( * ) Notice: Subject to any disclaimer, the term of this patent is extended or adjusted under 35 U.S.C. 154(b) by 0 days.

(21) Appl. No.: 13/481,989

(22) Filed: May 29, 2012

(65) Prior Publication Data

US 2012/0237431 A1    Sep. 20, 2012

Related U.S. Application Data

(63) Continuation of application No. PCT/JP2010/071041, filed on Nov. 25, 2010.

(30) Foreign Application Priority Data

Nov. 27, 2009   (JP) ................................. 2009-269777

(51) Int. Cl.
| | |
|---|---|
| *C30B 11/00* | (2006.01) |
| *C30B 35/00* | (2006.01) |
| *C30B 28/06* | (2006.01) |
| *C30B 19/00* | (2006.01) |
| *B01J 3/04* | (2006.01) |
| *B01D 9/00* | (2006.01) |
| *C01B 21/06* | (2006.01) |

(52) U.S. Cl.
USPC ........... 423/409; 423/406; 423/351; 117/206; 117/205; 117/200; 117/224; 117/71; 117/64; 422/245.1

(58) Field of Classification Search
None
See application file for complete search history.

(56) References Cited

U.S. PATENT DOCUMENTS

| | | | | |
|---|---|---|---|---|
| 4,900,525 | A * | 2/1990 | D'Angelo et al. | 117/205 |
| 7,335,262 | B2 * | 2/2008 | Dwilinski et al. | 117/206 |

(Continued)

FOREIGN PATENT DOCUMENTS

| | | |
|---|---|---|
| EP | 1 405 936 A1 | 4/2004 |
| EP | 1 514 958 A1 | 3/2005 |

(Continued)

OTHER PUBLICATIONS

Sitar; An Integrated Approach to the Bulk-III Nitride Crystal Growth and Wafering; Dec. 6, 2007.*

(Continued)

*Primary Examiner* — Guinever Gregorio
(74) *Attorney, Agent, or Firm* — Oblon, Spivak, McClelland, Maier & Neustadt, L.L.P.

(57) ABSTRACT

To provide a production method for a nitride crystal, where a nitride crystal can be prevented from precipitating in a portion other than on a seed crystal and the production efficiency of a gallium nitride single crystal grown on the seed crystal can be enhanced. In a method for producing a nitride crystal by an ammonothermal method in a vessel containing a mineralizer-containing solution, out of the surfaces of said vessel and a member provided in said vessel, at least a part of the portion coming into contact with said solution is constituted by a metal or alloy containing one or more atoms selected from the group consisting of tantalum (Ta), tungsten (W) and titanium (Ti), and has a surface roughness (Ra) of less than 1.80 μm.

7 Claims, 4 Drawing Sheets

(56) References Cited

U.S. PATENT DOCUMENTS

| | | | |
|---|---|---|---|
| 2011/0012233 A1* | 1/2011 | Ishibashi et al. | 257/615 |
| 2011/0268645 A1 | 11/2011 | Mikawa et al. | |
| 2012/0017825 A1* | 1/2012 | D'Evelyn et al. | 117/58 |
| 2012/0112320 A1 | 5/2012 | Kubo et al. | |
| 2012/0164057 A1 | 6/2012 | Fujisawa et al. | |

FOREIGN PATENT DOCUMENTS

| | | |
|---|---|---|
| JP | 2003-511326 | 3/2003 |
| JP | 2004-002152 | 1/2004 |
| JP | 2005-008444 | 1/2005 |
| JP | 2005-179138 | 7/2005 |
| JP | 2005-521625 | 7/2005 |
| JP | 2005-289797 | 10/2005 |
| JP | 2005289797 A * | 10/2005 |
| JP | 2006-514581 | 5/2006 |
| JP | 2006-315947 | 11/2006 |
| JP | 2007-039321 | 2/2007 |
| JP | 2008-069028 | 3/2008 |
| JP | 2009-500284 | 1/2009 |
| WO | WO 01/24921 | 4/2001 |
| WO | WO 03/083187 | 10/2003 |
| WO | WO03/097906 | 11/2003 |
| WO | WO 03/098708 | 11/2003 |
| WO | WO 2004/071649 | 8/2004 |
| WO | WO 2007/008198 | 1/2007 |

OTHER PUBLICATIONS

U.S. Appl. No. 13/427,058, filed Mar. 22, 2012, Fujisawa, et al.
U.S. Appl. No. 13/661,090, filed Oct. 26, 2012, Mikawa, et al.
International Search Report issued Dec. 28, 2010 in PCT/JP2010/071041 filed Nov. 25, 2010.

* cited by examiner

PRODUCTION METHOD, PRODUCTION VESSEL AND MEMBER FOR NITRIDE CRYSTAL

TECHNICAL FIELD

The present invention relates to an ammonothermal method for growing a nitride crystal. More specifically, the present invention relates to an ammonothermal method characterized in the material of the vessel in which the nitride crystal is grown.

BACKGROUND ART

The ammonothermal method is a method for producing a desired material by using an ammonia solvent in a supercritical state and/or a subcritical state and utilizing the dissolution-precipitation reaction of a raw material. In applying the ammonothermal method to crystal growth, a supersaturated state due to a temperature difference is generated by making use of the temperature dependency of the solubility of a raw material in an ammonia solvent, whereby a crystal is precipitated.

In a hydrothermal method that is similar to the ammonothermal method, crystal growth is performed by using water in a supercritical state and/or a subcritical state for the solvent, and this method is applied mainly to an oxide crystal such as quartz ($SiO_2$) and zinc oxide (ZnO).

On the other hand, the ammonothermal method can be applied to a nitride crystal and is being utilized for the growth of a nitride crystal such as gallium nitride. Growth of a gallium nitride crystal by the ammonothermal method is a reaction in a supercritical ammonia environment at a high temperature and a high pressure (500° C. or more, 150 MPa or more), and design of the apparatus or selection of the material so as to withstand such an environment is not easy.

Since solubility of gallium nitride in pure ammonia in a supercritical state is extremely low, a mineralizer is added to enhance the solubility and thereby accelerate the crystal growth. The mineralizer is classified into an acidic mineralizer represented by an ammonium halide $NH_4X$ (X=Cl, Br or I) and a basic mineralizer represented by an alkali amide $XNH_2$ (X=Li, Na or K). The supercritical ammonia environment containing such a mineralizer is a very harsh corrosive environment.

A pressure vessel (autoclave) can be produced by using a material having strength high enough to withstand the temperature and pressure in the corrosive environment above (for example, Alloy 625 and RENE 41 which are an Ni-based superalloy), but the pressure vessel does not have complete corrosion resistance to supercritical ammonia. In particular, the acidic mineralizer has a strong propensity to corrode the above-described alloy and therefore, it is required to establish a technique for resisting corrosion by using a material having high corrosion resistance.

In this connection, in the case of using an acidic mineralizer, a noble metal (platinum, iridium, and platinum-iridium alloy) confirmed to be resistant to corrosion is used as a material for lining the inner surface of an autoclave or as a material for an inner cylinder-type reaction vessel (Patent Document 1).

In growing a gallium nitride single crystal by the ammonothermal method, a seed crystal is usually used. A crystal having a lattice constant the same as or very close to that of the crystal to be grown is used. A most ideal seed crystal is a gallium nitride single crystal, and a gallium nitride single crystal is obtained by homoepitaxial growth thereon.

However, in practice, a gallium nitride fine crystal is sometimes unintentionally precipitated in a place other than on the seed crystal. This precipitation occurs due to spontaneous nucleus generation. The place other than on the seed crystal means the inner surface of the reaction vessel, that is, the surface of the noble metal lining material or the surface of a seed crystal-holding structure.

The gallium nitride fine crystal due to spontaneous nucleus generation inhibits crystal growth on the seed crystal where a crystal should be precipitated, and this gives rise to reduction in the productivity. Accordingly, for enhancing the productivity of a nitride crystal, it is inevitable to prevent precipitation of a gallium nitride fine crystal in a place other than on the seed crystal as much as possible.

As the method for solving such a problem, there has been proposed a method where a substance differing in the critical density from the solvent ammonia is introduced into the reaction vessel and the substance is unevenly distributed to the top or bottom of the reaction vessel by utilizing a critical density difference, thereby preventing crystal precipitation in those portions (Patent Document 2).

Furthermore, in order to prevent the generated gallium nitride fine crystal from being desorbed and taken into a nitride crystal under growing, it has been proposed to dispose, for example, a precipitate collection net and an umbrella plate for preventing precipitation (Patent Document 3).

RELATED ART

Patent Document

Patent Document 1: JP-A-2005-289797 (the term "JP-A" as used herein means an "unexamined published Japanese patent application")
Patent Document 2: JP-A-2007-39321
Patent Document 3: JP-A-2004-2152

SUMMARY OF THE INVENTION

Problems that the Invention is to Solve

A technique of lining the inner surface of a reaction vessel with a noble metal such as platinum, iridium and platinum-iridium alloy so as to prevent corrosion by supercritical ammonia is being widely employed. However, a large amount of a nitride fine crystal due to spontaneous nucleus generation is attached to the surface of the noble metal lining material. This causes a problem of stealing the amount precipitated on a seed crystal where a crystal should be precipitated and reducing the productivity of a nitride crystal.

Heretofore, the material has been selected by taking into account only corrosion resistance in supercritical ammonia and therefore, produceability and attachment of a crystal due to spontaneous nucleus generation have not been considered. In actual crystal growth, the above-described problem is very important, and a material having capability of suppressing production and attachment of a crystal due to spontaneous crystal generation, in addition to corrosion resistance, must be selected.

When a nitride fine crystal is attached to the surface of a noble metal lining material, not only the raw material that should be precipitated as a nitride single crystal on a seed crystal is consumed to reduce the productivity, but also unevenness is produced on the wall surface by the precipitation, causing obstruction of the convection of a solution.

Also, the produced nitride fine crystal is desorbed in a solution and conveyed by convection and on reaching the surface of a nitride single crystal during growth, is taken into the inside of the crystal, giving rise to a solid-phase inclusion.

Furthermore, when the nitride fine particle is thick deposited, this inhibits thermal conduction, leading to changing the environment inside an autoclave and causing a nitride raw material in a solution to change in its degree of supersaturation that is a most important parameter to growth of a nitride single crystal.

Accordingly, although the material by a conventional technique satisfies the corrosion resistance, with respect to precipitation and attachment of a nitride fine crystal on the surface lined with the anticorrosive material, an answer for solving the problem is not found at all.

The effect exerted by the introduction of a substance differing in the critical density of supercritical ammonia into a reaction vessel proposed in Patent Document 2 is limited by the upper pipe section or the like and not enough to prevent precipitation and attachment to the inner surface of a reaction vessel and the surface of a structure inside the reaction vessel, which are majority occupied by a nitride fine crystal due to spontaneous nucleus generation.

Also, arrangement of a collection net and an umbrella plate proposed in Patent Document 3 is not enough to prevent reduction in the productivity of a nitride crystal, because a function of preventing precipitation and attachment of a nitride fine crystal is lacking.

Means for Solving the Problems

As a result of intensive studies to solve the problems above, the present inventors have found that in the production of a nitride crystal by an ammonothermal method, the amount of precipitated nitride fine crystals due to spontaneous nucleus generation differs more greatly than expected, according to the kind and surface state of the material inside a production vessel.

Furthermore, it is found that when a specific kind of a material having a smooth surface state is used for the material inside a production vessel, the amount of precipitated nitride fine crystals on the surface inside the production vessel can be kept to a very small amount. The material found here has been confirmed to have also very excellent corrosion resistance to supercritical ammonia.

When the above-described specific kind of a material having very characteristic properties is applied to the inner surface of a lining material of a production vessel or the surface of an internal structural member, this has been found to be greatly effective in preventing production of a nitride fine crystal due to spontaneous nucleus generation and enhancing the productivity of a nitride crystal. The present invention has been accomplished based on these findings.

That is, the gist of the present invention resides in the followings.

[1] A method for producing a nitride crystal by an ammonothermal method in a vessel containing a mineralizer-containing solution, wherein out of the surfaces of said vessel and a member provided in said vessel, at least a part of the portion coming into contact with said solution is constituted by a metal or alloy containing one or more atoms selected from the group consisting of tantalum (Ta), tungsten (W) and titanium (Ti), and has a surface roughness (Ra) of less than 1.80 µm.

[2] The method for producing a nitride crystal as described in the item [1], wherein at least a part of the surface of crystal growth region in said vessel is constituted by said metal or alloy.

[3] The method for producing a nitride crystal as described in the item [2], wherein 20% or more of the area of the surface of said crystal growth region is constituted by said metal or alloy.

[4] The method for producing a nitride crystal as described in any one of the items [1] to [3], wherein the surface of said member is constituted by said metal or alloy.

[5] The method for producing a nitride crystal as described in the item [4], wherein said member is disposed in the crystal growth region of said vessel.

[6] The method for producing a nitride crystal as described in any one of the items [1] to [5], wherein a control is carried out so as to keep an oxygen-containing substance from contacting with the portion constituted by said metal or alloy.

[7] The method for producing a nitride crystal as described in any one of the items [1] to [6], wherein said vessel is an inner cylinder disposed in an autoclave and a nitride crystal is produced in said inner cylinder in a state of an oxygen-free substance filling a space between said autoclave and said inner cylinder.

[8] A vessel for production of a nitride crystal, which is a vessel for charging a mineralizer-containing solution therein and producing a nitride crystal by an ammonothermal method, wherein out of the surface of said vessel, at least a part of the portion coming into contact with said solution is constituted by a metal or alloy containing one or more atoms selected from the group consisting of tantalum (Ta), tungsten (W) and titanium (Ti), and has a surface roughness (Ra) of less than 1.80 µm.

[9] The vessel for production of a nitride crystal as described in the item [8], wherein at least a part of the surface of crystal growth region in said vessel is constituted by said metal or alloy.

[10] The vessel for production of a nitride crystal as described in the item [9], wherein 20% or more of the area of the surface of said crystal growth region is constituted by said metal or alloy.

[11] The vessel for production of a nitride crystal as described in any one of the items [8] to [10], wherein out of the surface of said vessel, at least a part of the portion coming into contact with said solution is constituted by W or an alloy containing W.

[12] A member, which is a member disposed in a system for producing a nitride crystal by an ammonothermal method by using a mineralizer-containing solution, wherein at least a part of the surface of said member is constituted by a metal or alloy containing one or more atoms selected from the group consisting of tantalum (Ta), tungsten (W) and titanium (Ti), and has a surface roughness (Ra) of less than 1.80 µm.

[13] The member as described in the item [12], which is a gasket.

[14] A nitride crystal produced by the production method described in any one of the items [1] to [7].

[15] The nitride crystal as described in the item [14], which is gallium nitride.

Advantage of the Invention

According to the production method of the present invention, a nitride fine crystal can be prevented from precipitating in a portion other than on a seed crystal where the crystal should be precipitated as single crystal. As a result, the production efficiency of a nitride crystal grown on the seed crystal can be greatly enhanced.

Also, the nitride crystal of the present invention is a uniform high-quality crystal and therefore, is useful as a semiconductor crystal or the like for a light-emitting device or an electronic device.

MODE FOR CARRYING OUT THE INVENTION

Figure 1:
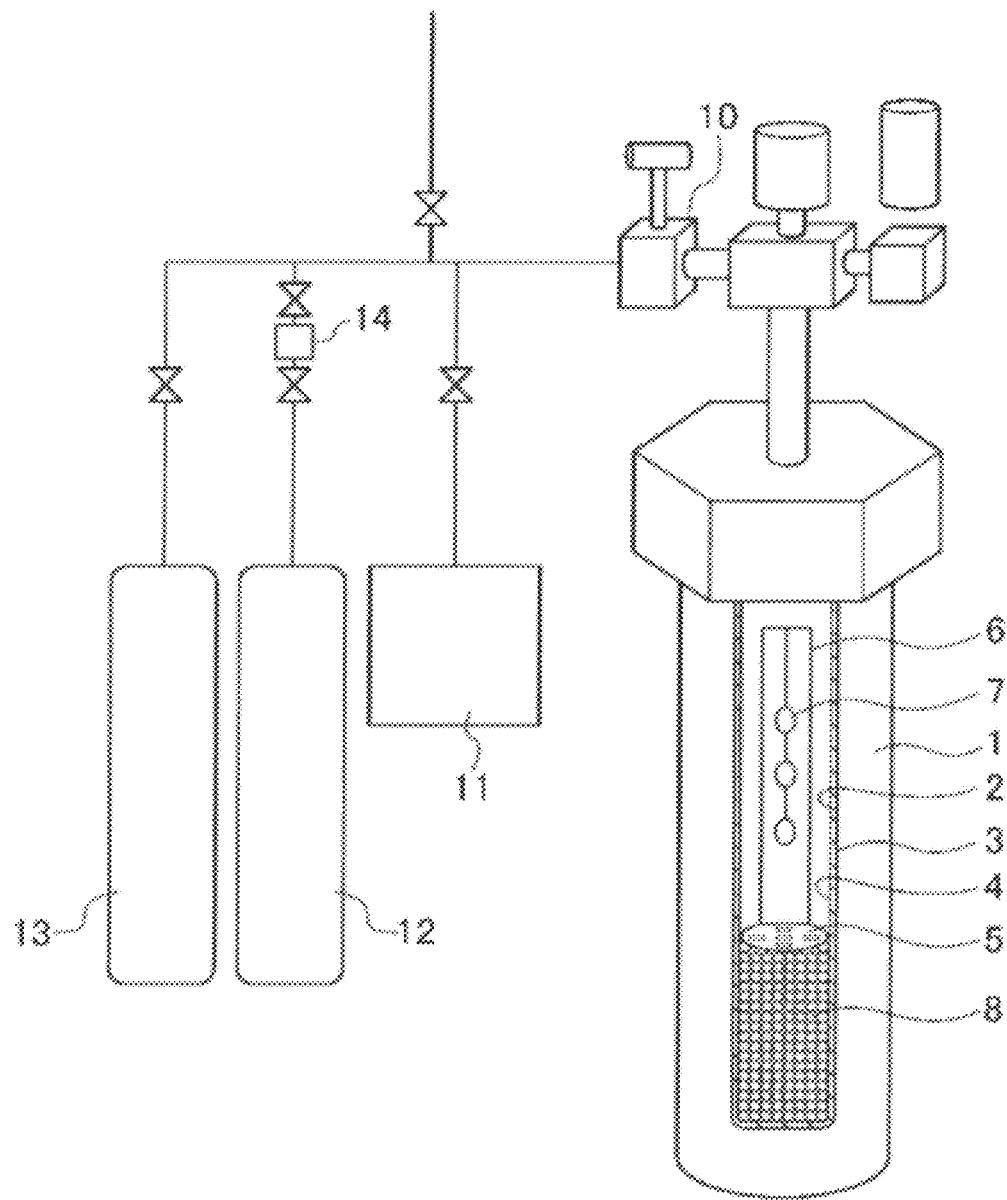
FIG. 1 is a schematic view of a production apparatus equipped with a production vessel for a nitride crystal of the present invention.

The production method for a nitride crystal of the present invention, and the production vessel and member used therefor are described in detail below. The following descriptions of constituent requirements are based on representative embodiments of the present invention, but the present invention is not limited to these embodiments. In the description of the present invention, the numerical value range expressed by using "from (numerical value) to (numerical value)" means a range including the numerical values before and after "to" as the lower limit value and the upper limit value, respectively.
(Vessel)

The production method for a nitride crystal of the present invention is performed in a vessel. The term "vessel" as used herein means a vessel for performing the production of a nitride crystal by an ammonothermal method in the state allowing a mineralizer-containing solution to be put into direct contact with the inner wall surface of the vessel.

Suitable examples of the vessel include an autoclave itself, and an inner cylinder provided in an autoclave. The vessel for use in the present invention, such as autoclave and inner cylinder, is selected from those capable of withstanding high-temperature high-pressure conditions at the time of growing a nitride crystal by an ammonothermal method.

The material constituting the vessel is preferably a material having high high-temperature strength and corrosion resistance, more preferably an Ni alloy or a Co alloy such as Stellite (registered trademark of Deloro Stellite Company Inc.), which are excellent in the corrosion resistance to a solvent such as ammonia, and still more preferably an Ni alloy.

Specific examples of the Ni alloy include Inconel 625 (Inconel is a registered trademark of Huntington Alloys Canada Ltd., hereinafter the same), Nimonic 90 (Nimonic is a registered trademark of Special Metals Wiggin Ltd., hereinafter the same), RENE 41, Hastelloy, and Waspalloy.

The compositional ratio of such an alloy may be appropriately selected according to the temperature and pressure conditions of the solvent in the system, the reactivity and/or oxidizing power or reducing power with the mineralizer and a reaction product thereof contained in the system, and the conditions such as pH.

Although the corrosion resistance of such an alloy is high, the corrosion resistance is not so high as perfectly eliminating the effect on the crystal quality. Therefore, in a supercritical ammonia atmosphere, particularly in a harsher corrosive environment, a component such as Ni, Cr and Fe is eluted into a solution from the alloy and taken into the crystal.

For this reason, in the production method of the present invention, the inner surface of the vessel is preferably further covered by a method such as direct lining with a material excellent in the corrosion resistance so as to prevent corrosion of the inner surface of the vessel.

The production method of the present invention is generally performed in the state of a member being disposed in the vessel. The term "member" as used herein means a thing that is disposed in the vessel when producing a nitride crystal by an ammonothermal method in a solution containing a mineralizer and can be separated from the vessel.

Examples thereof include a growth frame for holding a seed crystal, a baffle plate for controlling the convection of a solution, a raw material cage, and a wire for hanging a seed crystal. In the present invention, the surface of such a member is also preferably covered with a material excellent in the corrosion resistance.
(Material Used in Portion Corning into Contact with Solution Containing Mineralizer)

The production method of the present invention is characterized in that in a vessel for performing the crystal growth of a nitride such as gallium nitride, a specific material is used in a portion coming into contact with ammonia, at least in a portion coming into contact with ammonia containing a mineralizer.

The portion coming into contact with a solution containing a mineralizer is, for example, an inner surface of an autoclave, an inner surface of an inner cylinder, and surfaces of a growth frame for holding a seed crystal, a baffle plate for controlling the convection of a solution, and a raw material cage. The production method of the present invention is characterized in that by appropriately controlling the kind of the material constituting such a surface and the surface roughness, a nitride fine crystal due to spontaneous nucleus generation is prevented from being produced.

As described above, the material constituting the inner surface of the autoclave and the inner surface of the cylinder must have high corrosion resistance to supercritical ammonia and/or supercritical ammonia containing a mineralizer.

Conventionally, the selection criterion for the inner surface material is only corrosion resistance and therefore, a noble metal such as Pt and Pt—Ir alloy has been selected as a most preferred material. However, many nitride fine crystals due to spontaneous nucleus generation are attached to such a noble metal surface, and precipitation on a seed crystal is thereby inhibited, resulting in reduction in the productivity.

As a material satisfying two requirements of high corrosion resistance and difficult attachment of a nitride fine crystal due to spontaneous nucleus generation, the present inventors have found the following material.

The material for the portion coming into contact with a solution containing a mineralizer, which can be used in the present invention, is a metal or alloy containing one or more atoms selected from the group consisting of tantalum (Ta), tungsten (W) and titanium (Ti). That is, the material includes tantalum (Ta), a tantalum alloy (Ta alloy), tungsten (W), a tungsten alloy (W alloy), titanium (Ti), and a titanium alloy (Ti alloy).

The Ta alloy includes, for example, a tantalum-tungsten alloy (Ta—W alloy).

In this connection, the term "M alloy" (M is a metal) as referred to in the description of the present invention means an alloy having a composition containing M at a largest proportion.

The composition of the Ta alloy preferably contains Ta at a proportion of 50 wt % or more, more preferably 70 wt % or more, still more preferably 85 wt % or more.

The composition of the Ta—W alloy preferably contains W at a proportion of 0.1 wt % or more, more preferably 1.0 wt % or more, still more preferably 2.5 wt % or more.

The composition of the Ta—W alloy preferably contains W at a proportion of 20 wt % or less, more preferably 15 wt % or less, still more preferably 10 wt % or less.

The composition of the W alloy preferably contains W at a proportion of 50 wt % or more, more preferably 70 wt % or more, still more preferably 85 wt % or more.

The composition of the Ti alloy preferably contains Ti at a proportion of 50 wt % or more, more preferably 70 wt % or more, still more preferably 85 wt % or more.

In the present invention, as for these materials, one kind may be used, or two or more kinds may be used in combination. Also, the material may be used in combination with a material other than those described above, for example, a material conventionally used as an anticorrosive lining material, such as platinum (Pt), platinum iridium alloy (Pt—Ir alloy) and iridium (Ir).

For example, since a nitride fine crystal due to spontaneous nucleus generation is grossly precipitated, among others, in a portion where the degree of supersaturation of a nitride raw material in the solution becomes large, the material above may be used only in the portion subject to significant precipitation of a fine crystal.

The portion which comes to have a particularly large degree of supersaturation is a region where a nitride single crystal grows on a seed crystal (hereinafter referred to as a crystal growth region), among others, a portion where the temperature becomes low. The temperature distribution depends on the heating/cooling structure of the vessel, but in general, the upper part of the crystal growth region is more cooled and therefore, a nitride fine crystal due to spontaneous nucleus generation is liable to be precipitated in the upper part of the crystal growth region.

Accordingly, it may be sufficient to apply lining only at least in a range where such a fine crystal is liable to be precipitated. The range which should be lined with a metal or alloy containing one or more atoms selected from the group consisting of Ta, W and Ti is preferably 20% or more, more preferably 35% or more, still more preferably 50% or more, of the inner surface area of the crystal growth region.

The present invention is also characterized in that in order to more effectively suppress precipitation of a nitride fine crystal due to spontaneous nucleus generation, out of surfaces of the vessel and a member disposed in the vessel, such as lining material, the surface roughness of at least a portion coming into contact with a solution containing mineralizer is adjusted. That is, with a surface roughness (Ra) of not more than 1.80 μm, the precipitation of a nitride fine crystal due to spontaneous nucleus generation is suppressed.

In the present invention, out of the surfaces of the vessel and a member disposed in the vessel, the surface roughness (Ra) of at least a portion coming into contact with a solution containing a mineralizer is less than 1.80 μm, preferably less than 1.6 μm, more preferably less than 1.0 μm, still more preferably less than 0.1 μm. If the surface roughness (Ra) is 1.80 μm or more, a nitride fine crystal is precipitated due to spontaneous nucleus generation.

The method for adjusting the surface roughness (Ra) to the range above is not particularly limited, and a known treatment method may be appropriately applied to the surfaces of the vessel and a member disposed in the vessel. For example, the surface roughness (Ra) is preferably adjusted to the range above by subjecting the surfaces of the vessel and a member disposed in the vessel to a treatment such as cutting with a turning tool, grinding with a grindstone, buffing, and electrolytic polishing. The surface roughness (Ra) is measured by the method described in Examples later.

(Lining of Inner Surface of Autoclave)

As the method for lining the inner surface of an autoclave, the method described, for example, in JP-A-2006-193355 may be referred to. As the lining material for the inner surface of an autoclave, a metal or alloy containing one or more atoms selected from the group consisting of Ta, W and Ti may be suitably used.

Above all, Ta, a Ta alloy and a Ta—W alloy each having excellent ductility are preferred, and Ta and a Ta—W alloy are more preferred. Also, in view of mechanical strength and durability, W and a W alloy are preferred.

The thickness of the lining layer is not particularly specified as long as it is a thickness large enough to bring out corrosion resistance, but considering the mechanical durability, the thickness is preferably 100 μm or more, more preferably 200 μm or more, still more preferably 500 μm or more.

Also, the thickness of the lining layer is preferably 15 mm or less, more preferably 10 mm or less, still more preferably 5 mm or less. By setting the thickness to 15 mm or less, the productivity can be prevented from reduction due to decrease in the inner diameter of an autoclave.

As the lining method, a method where the lining material is produced to nearly conform to the shape of the inner surface of an autoclave and mechanically fit with the inner surface of an autoclave is suitably employed.

In particular, Ta and a Ta—W alloy are oxidized in a high-temperature environment when oxygen is present, and therefore, oxygen present in the gap is preferably removed. For this purpose, a method of inserting the lining material into an autoclave and then degassing oxygen remaining in the gap by a vacuum evacuation apparatus can be applied.

A method where after vacuum evacuation, in order to more increase the adherence between the lining material and the inner surface of the autoclave, a pressure is generated inside the autoclave to pressure-contact the lining material with the inner surface of the autoclave, is also suitably used.

When the temperature at the pressure-contacting is high, interdiffusion due to heat occurs and therefore, stronger adherence is obtained. Pressure-contacting by an inner pressure may be performed in the process of producing a production vessel for a crystal or may be concomitantly performed during the temperature rise and the pressure rise in the crystal production operation.

The lining material may be closely contacted directly with the inner surface of the autoclave as described above, but it is also possible to insert the lining material into the inner surface of a reinforcing tube produced from a second material and insert the reinforcing tube into the autoclave.

For the second material, the same material as the autoclave, for example, a nickel-based alloy such as Inconel 625, is suitably used because of its good corrosion resistance to supercritical ammonia. A material other than a nickel-based alloy may be also used as long as it has corrosion resistance to supercritical ammonia.

For example, after producing a reinforcing tube from Ti or a Ti alloy, which is usable also as the lining material, the inner surface of the reinforcing tube may be lined with Ta or a Ta—W alloy. The adherence between the lining material and the inner surface of the reinforcing tube and the adherence between the reinforcing tube and the inner surface of the autoclave may be also increased by the same method as the above-described method for increasing the adherence between the lining material and the inner surface of an autoclave.

In the case of using Ta or a Ta—W alloy as the lining material, oxidation may occur due to the presence of oxygen. In order to protect the outer surface of the lining material coming into contact with the inner surface of the autoclave or the inner surface of the reinforcing tube from oxidation, a protective film may be formed.

The oxidation resistance may be increased by coating a metal such as nickel (Ni), chromium (Cr), copper (Cu), gold (Au) and platinum (Pt) on the outer surface of the lining material. Such a metal works out to an intermediate layer and interdiffuses, and the adherence between the inner surface of the autoclave and the inner surface of the reinforcing tube is thereby enhanced, so that both actions of mechanical strength and oxidation prevention can be expected.

The autoclave for use in the production method of the present invention is required to withstand a high temperature and a high pressure up to a temperature of 650° C. and a pressure of 300 MPa. The lid of the autoclave has an openable/closable structure and must have such an airtight structure as realizing high sealability and no occurrence of leakage at the above-described temperature and pressure. Furthermore, the lid must be an airtight seal part having mechanical strength high enough to repeat opening and closing with each operation for crystal growth and maintain the airtightness by surviving the repeated operations.

The lining structure above can be preferably applied to the inner surface of the autoclave, but in the airtight seal part, a material having mechanical strength at a high temperature must be selected. The airtight seal part need to be a material satisfying both of the mechanical strength and the corrosion resistance to supercritical ammonia, and a Ta—W alloy, a Ti alloy and Ir are preferably used.

Here, the W content in the Ta—W alloy is preferably 5 wt % or more, more preferably 9 wt % or more. Also, the Ti alloy includes, for example, a high-strength titanium alloy such as Ti-6Al-4V (Ti with 6 wt % aluminum and 4 wt % vanadium).

In the case where the lining material for the airtight seal part and the lining material for the autoclave main body differ in the material, these materials can be joined by welding. The welding in air brings about deterioration of the material due to oxidation and nitridation of the material and therefore, TIG (Tungsten Inert Gas) welding is preferably used. Usually, a good welding result can be obtained by performing the welding in an argon gas atmosphere. Other than TIG welding, electron beam welding and laser welding can be also applied.

In order to seal the lid to the autoclave main body by using the airtight seal part, usually, a gasket is interposed therebetween and a seal surface pressure is generated between the gasket and the airtight seal part to thereby bring out high sealability. Keeping the inside of the autoclave at a high pressure may be attained by setting the seal surface pressure above to be higher than the pressure inside the autoclave.

The seal surface pressure is generated by strongly pressing the gasket against the airtight seal part, and the material for the gasket is also required to have the same strength as that of the airtight seal part. The gasket is similarly a portion coming into contact with supercritical ammonia containing a mineralizer and on this account, the material therefor is preferably the same material as that used for the airtight seal part, namely, a Ta—W alloy, a Ti alloy or Ir.

(In Case of Using Inner Cylinder)

Figure 2:
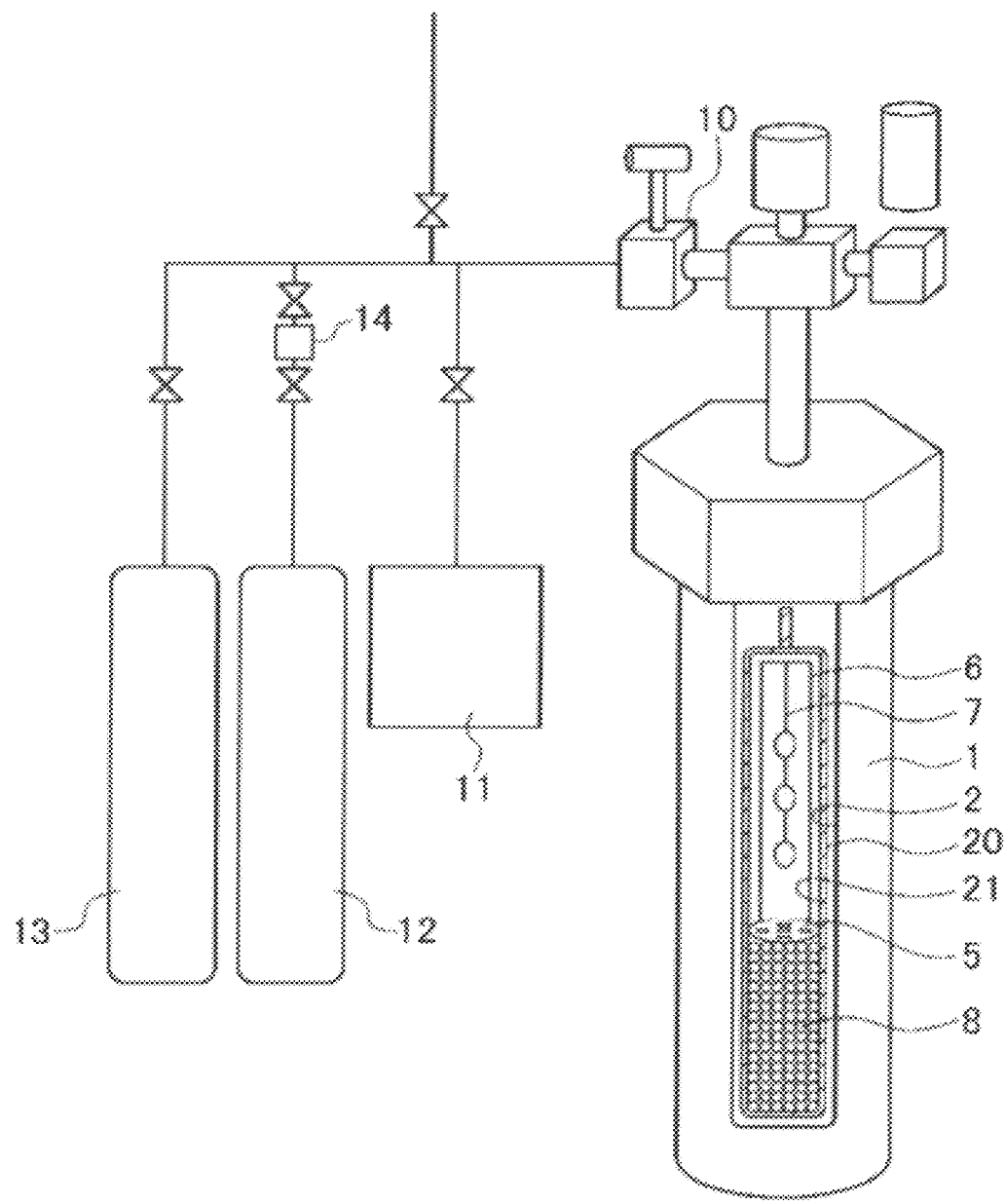
FIG. 2 is a schematic view of a production apparatus equipped with another production vessel for a nitride crystal of the present invention.

In order to attain corrosion resistance in a crystal growth environment and prevent attachment of a fine crystal due to spontaneous nucleus generation, other than the method of applying lining directly to the inner surface of the autoclave, there is a method of inserting an inner cylinder into the autoclave (see, for example, 20 of FIG. 2).

Growth of a nitride crystal on the seed crystal is performed in the inner cylinder and therefore, the supercritical ammonia containing a mineralizer comes into contact only with the inner surface of the inner cylinder. On this account, the range constituted by the material of the present invention may be at least the inner surface of the inner cylinder.

A space between the outer side of the inner cylinder and the inner surface of the autoclave is filled with a medium capable of generating a hydrostatic pressure, such as ammonia and water. The medium is preferably ammonia. By the filling with the same substance as the solvent filling the inner cylinder, an effect of making it easy to balance the pressure between the inside and the outside of the inner cylinder is attained.

Usually, a mineralizer need not be added to ammonia filling the outside and therefore, the corrosivity to the autoclave material is reduced. On this account, in the case of using an inner cylinder, anticorrosive lining may not be applied to the inner surface of the autoclave.

Similarly, the outer surface of the inner cylinder may not be a material excellent in the corrosion resistance, and a material employed for the autoclave, such as Ni-based alloy, may be used. In this case, the inner cylinder may be produced using an Ni-based alloy and then lined with the same material by the same method as in the method for lining the inner surface of the autoclave.

Other than the method of lining the inner surface of the inner cylinder, it is also preferably performed to produce the inner cylinder from a metal or alloy containing one or more atoms selected from the group consisting o Ta, W and Ti. In this case, both the inner surface and the outer surface of the inner cylinder are formed of the same material. When the pressure is balanced between inside the inner cylinder and outside the inner cylinder, the stress causing deformation of the inner cylinder is small and since the thickness of the inner cylinder does not become a problem, a thickness of about 0.1 mm may be sufficient.

On the other hand, the procedure for performing crystal growth by using an inner cylinder includes a process of filling the inside of the inner cylinder with ammonia. Here, filling with ammonia is performed by setting the inner cylinder to a temperature not more than the liquefaction temperature of ammonia (−33° C.). Ammonia injected as a gas is liquefied in the cooled inner cylinder and produces a negative pressure and in turn, filling further proceeds.

Before filling the inner cylinder with ammonia, high-temperature baking, nitrogen purging and vacuuming of the inner cylinder are preferably performed so as to remove impurities such as oxygen and water inside the inner cylinder. Particularly, in the vacuuming step, an external pressure by an atmospheric pressure (about 1 atm) is imparted to the inner cylinder and therefore, strength high enough to cause no deformation of the inner cylinder is required. Strength may be imparted by making large the thickness of the inner cylinder to cause no deformation, or the deformation may be prevented by partially increasing the thickness.

Next, the procedure advances to a step of inserting the filled inner cylinder into an autoclave, but when this step is performed at room temperature, the vapor pressure of ammonia rises (about 8 kg/cm$^2$ at 20° C.) and the pressure inside the inner cylinder rises. Therefore, the strength must be designed to withstand the vapor pressure of ammonia at the handling temperature.

A pipe for injecting ammonia is connected to the top of the inner cylinder, and the inner surface of this pipe is also preferably lined with a metal or alloy containing one or more atoms selected from the group consisting of Ta, W and Ti. The pipe may be entirely made up of the material above, or after the pipe is made up of an Ni-based alloy or the like, at least the inner surface may be lined with the material above.

(Configuration Example 1 of Crystal Production Apparatus: Lining of Inner Surface of Autoclave)

FIG. 1 shows a specific example of the crystal production apparatus including an autoclave, which can be used for the production method of the present invention.

The inner surface of the autoclave of FIG. 1 is subjected to lining with a metal or alloy containing one or more atoms selected from the group consisting of Ta, W and Ti. FIG. 1 is a crystal production apparatus comprising an autoclave 1 with the inside being partitioned into two parts by a baffle plate 5. In the inside that is partitioned into two parts, the lower side is a raw material dissolution region for dissolving a raw material 8 in ammonia, and the upper side is a crystal growth region for loading a seed crystal 7 therein and growing a nitride crystal.

The autoclave 1 is sealed with a lid and can be heated by a heater disposed on the outside. The heating temperature can be measured by a thermocouple. A conduit pipe is provided in the lid of the autoclave and, as shown, leads to a vacuum pump 11, an ammonia tank 12 and a nitrogen tank 13 through a valve 10. For the specific use embodiment of the production apparatus shown in FIG. 1, working examples described later may be referred to.

The baffle plate 5 is used to divide the crystal growth region from the raw material dissolution region, and the open pore ratio of the baffle plate 5 is preferably 2 to 30%, more preferably 5 to 20%. The material for the surface of the baffle plate is preferably the same as the material lining the inner surface of the autoclave.

The material for the surface of a member disposed inside the autoclave is preferably the same as the material lining the inner surface of the autoclave. The member disposed in the inside indicates the entire structure in the autoclave except for the baffle plate, and a frame for holding a seed crystal, a wire for hanging a seed crystal, and a raw material cage come under the member.

With respect to the valve, pressure gauge and conduit pipe connected to the autoclave, those where at least the surface is constructed of an anticorrosive material are preferably used. For example, the material is SUS316 (JIS Standards), and it is more preferred to use Inconel 625. Incidentally, in the crystal production apparatus used when implementing the production method of the present invention, a valve, a pressure gage and a conduit pipe need not be necessarily disposed.

(Configuration Example 2 of Crystal Production Apparatus: Inner Cylinder)

FIG. 2 shows a specific example of the crystal production apparatus where an inner cylinder is inserted into an autoclave. An inner cylinder 20 is disposed in an autoclave 1, and the inside of the inner cylinder has the same configuration as the inside of the autoclave of FIG. 1, that is, a baffle plate 5 for dividing a crystal growth region from a raw material dissolution region is provided, in which a seed crystal 7 and a frame 6 for holding the seed crystal are arranged in the upper part and a raw material 8 and a raw material cage are arranged in the lower part.

At least the inner surface 21 of the inner cylinder is constituted of a metal or alloy containing one or more atoms selected from the group consisting of Ta, W and Ti. Alternatively, the entire inner cylinder is preferably made up of the same material as above.

(Crystal Growth Condition)

As to the growth conditions for a nitride crystal in the present invention, the growth conditions for a nitride crystal in the normal ammonothermal method may be appropriately selected and employed. For example, the pressure during growth of a nitride crystal in the present invention is usually set to be preferably from 80 to 400 MPa, more preferably from 100 to 300 MPa, still more preferably from 100 to 250 MPa.

Also, as to the raw material for crystal growth, the raw material usually used for the growth of a nitride crystal by an ammonothermal method may be appropriately selected and used. For example, in the case of growing a gallium nitride crystal, metal gallium, gallium nitride or a mixture thereof may be used as the raw material working out to a gallium source.

As to other growth conditions for a nitride crystal, the column of Production Conditions of JP-A-2007-238347 may be referred to.

According to the production method of the present invention, a crystal can be grown at a rate of usually from 0.3 to 500 µm/day. The growth rate is preferably from 1 to 400 µm/day, more preferably from 10 to 300 µm/day, still more preferably from 20 to 250 µm/day. The growth rate as used herein is a value obtained by dividing the total dimension of a crystal grown on both surfaces of a plate-like seed crystal cut out at arbitrary crystal planes by the number of days for growth.

(Seed Crystal)

In the present invention, it is preferred to previously prepare a seed crystal in the crystal growth region and grow a nitride crystal on the seed crystal. When a seed crystal is used, a specific type of a crystal can be selectively grown. For example, in the case of growing a gallium nitride crystal, when a hexagonal gallium nitride crystal is used as the seed crystal, a hexagonal gallium nitride single crystal can be grown on the seed crystal.

As a seed crystal, a plate single crystal in the thin plate form is usually used, but the crystal orientation of the principal plane can be arbitrarily selected. The principal plane as used herein indicates a largest plane of a thin plate-like seed crystal.

In the case of a hexagonal gallium nitride single crystal, a seed crystal having a principal plane in various orientations such as polar plane represented by (0001) plane and (000-1) plane, semipolar plane represented by (10-12) plane, (10-12) plane, (20-21) plane and (20-2-1) plane, and nonpolar plane represented by (10-10) plane and (11-20) plane, is used, whereby the crystal can be grown in arbitrary orientations.

The cut-out orientation of the seed crystal is not limited to the above-described specific planes, and a plane displaced by an arbitrary angle from a specific plane may be also selected.

The surface roughness (Rms) of the seed crystal is preferably from 0.03 to 1.0 nm, more preferably from 0.03 to 0.5 nm, still more preferably from 0.03 to 0.2 nm.

The surface roughness (Rms) as used herein is a value measured by an atomic force microscope. When the surface roughness (Rms) is in the above-described preferred range, the two dimensional growth at the initial growth interface is smoothly started, and this is advantageous in that introduction of a crystal defect at the interface is suppressed and production of a cubic gallium nitride is liable to be inhibited. Such a surface roughness (Rms) may be attained, for example, by performing CMP (chemical mechanical polishing).

In the case of a seed crystal not having the above-described surface roughness, a nitride crystal is preferably grown after subjecting the surface to chemical etching or the like to remove the process-induced degradation layer. For example, the process-induced degradation layer can be preferably removed by etching the surface with an aqueous alkali solution such as KOH or NaOH at about 100° C. Also in this case, the same effect as in the case of controlling the surface roughness (Rms) is obtained.

(Production Process)

In implementing the production method of the present invention, first, a seed crystal, a nitrogen element-containing solvent, a raw material substance for crystal growth, and a mineralizer are charged into a vessel, and the vessel is tightly sealed. In place of a mineralizer, a substance capable of reacting with ammonia to produce a mineralizer may be charged.

The concentration of the mineralize may be from 0.1 to 10 mol % based on the amount of ammonia used for filling. In advance of introducing these materials into the vessel, the inside of the vessel may be deaerated. Also, during the introduction of the materials, an inert gas such as nitrogen gas may be flowed.

In the case of using an inner cylinder as the vessel, the inner cylinder is tightly sealed as above and disposed in the autoclave and then, the autoclave is closed. After closing the autoclave, an inert gas such as nitrogen gas may be flowed into the autoclave, the inside may be deaerated by a vacuum evacuation apparatus, or both may be performed in combination.

Next, as for filling with ammonia, in the case of not using an inner cylinder, the autoclave is filled with a predetermined amount of ammonia through a pipe connected to the autoclave. As described in the description of the case of using an inner cylinder, ammonia may be injected at a temperature not more than its liquefaction temperature and liquefied in the autoclave to achieve filling with a liquefied ammonia. It is also possible to fill the inside of the autoclave with ammonia while applying a pressure at room temperature.

The seed crystal is usually loaded in a vessel such as autoclave and inner cylinder, simultaneously at the time of packing a raw material substance, a mineralizer and an ammonia thermal decomposition catalyst, or loaded together with an ammonia thermal decomposition catalyst after packing a raw material substance and a mineralizer. The seed crystal is preferably fixed to a jig made of the same noble metal as the noble metal constituting the inner surface of the vessel. After the loading, the inside may be heated and deaerated, if desired.

Under the supercritical condition, a sufficiently high growth rate of a nitride crystal is obtained. The reaction time depends particularly on the reactivity of mineralizer and the thermodynamic parameters, that is, the numerical values of temperature and pressure. During synthesis or growth of a nitride crystal, the inside of the vessel is preferably held at a temperature and a pressure in the above-described preferred ranges.

The pressure is appropriately determined according to the temperature and the filling ratio of the solvent volume to the volume of the vessel. Originally, the pressure inside the vessel is unambiguously determined by the temperature and the filling ratio but in practice, slightly differs according to the raw material, the additive such as mineralizer, the non-uniformity of temperature in the vessel, and the presence of dead volume.

Usually, the ratio of the solvent injected into the vessel for achieving the above-described temperature range and pressure range of the vessel, that is, the filling ratio, is preferably from 20 to 95%, more preferably from 40 to 90%, still more preferably from 45 to 85%, based on the liquid density at the boiling point of the solvent in the free volume of the vessel, that is, (i) in the case of using a polycrystalline raw material and a seed crystal in the vessel, the volume remaining after subtracting the volumes of the seed crystal and a structure for placing the seed crystal therein from the volume of the vessel, or (ii) in the case of disposing a baffle plate, the volume remaining after further subtracting the volume of the baffle plate from the volume of the vessel.

Growth of a nitride crystal in the vessel is performed by heating the vessel, for example, with use of an electric furnace having a thermocouple to raise the temperature and thereby hold the inside of the vessel in a subcritical state or supercritical state of the solvent such as ammonia. The heating method and the temperature rise rate to a predetermined reaction temperature are not particularly limited, but the heating is usually performed for from several hours to several days. If desired, the temperature may be raised in multiple stages or the temperature raising speed may be varied in the temperature region. Also, the heating may be performed while partially cooling the system.

The reaction time after reaching a predetermined temperature differs depending on the kind of the nitride crystal, the kind of the raw material or mineralizer used, or the size or amount of the crystal produced but may be usually from several hours to several hundreds of days. During the reaction, the reaction temperature may be kept constant or may be gradually raised or lowered.

After the reaction time for producing a desired crystal has passed, the temperature is lowered. The temperature lowering method is not particularly limited, but the vessel may be left in the furnace after stopping the heating by the heater and allowed to cool, or the vessel may be taken out of the electric furnace and air-cooled. Rapid cooling with use of a coolant is also suitably used, if desired.

After the temperature of the outer surface of the vessel or the presumed temperature inside the vessel is lowered to a predetermined temperature or less, the vessel is opened. The predetermined temperature here is not particularly limited and usually, is preferably from −80° C. to 200° C., more preferably from −33° C. to 100° C. At this time, the valve may be opened in a state of a pipe being connected to the pipe connection port of the valve attached to the vessel and communicating with a vessel filled with water or the like.

Furthermore, the vessel is put into a vacuum state to thoroughly remove the ammonia solvent therein, if desired, and after drying, opened by putting off the lid or the like and thereafter, the produced nitride crystal, unreacted raw material and additives such as mineralizer can be taken out.

A nitride crystal can be produced in this way by the production method of the present invention. In order to produce a nitride crystal having a desired crystal structure, the production conditions must be appropriately adjusted.

(Nitride Crystal)

The kind of the nitride crystal obtained by the production method of the present invention is determined by the kind or the like of the selected raw material for crystal growth. According to the present invention, a nitride crystal of Group III of the periodic table can be preferably grown. The nitride crystal of Group III of the periodic table is preferably a gallium-containing nitride crystal, more preferably a gallium nitride crystal.

According to the production method of the present invention, a nitride crystal having a relatively large diameter can be also obtained. For example, a nitride crystal having a maximum diameter of preferably 50 mm or more can be obtained. The maximum diameter of the nitride crystal is more preferably 76 mm or more, still more preferably 100 mm or more.

Also, according to the production method of the present invention, precipitation of a nitride fine crystal in a portion other than on a seed crystal can be prevented, and therefore, a nitride fine crystal is less likely to be taken into a nitride crystal growing on the seed crystal, as a result, a nitride crystal having little crystal defects as compared with a nitride crystal produced by the conventional method can be obtained.

Furthermore, according to the production method of the present invention, the raw material can be prevented from being consumed for precipitation of a nitride fine crystal, so that the above-described nitride crystal having little crystal defects can be produced in a good yield.

EXAMPLES

The characteristic features of the present invention are described in greater detail below by referring to Examples and Comparative Examples. The materials, amounts used, ratios, processing contents, processing procedures and the like set forth in the following Examples can be appropriately changed without departing from the purport of the present invention. Accordingly, the scope of the present invention should not be construed as being limited to specific examples illustrated below.

Example 1

In this Example, an experiment of hanging a seed crystal and a test piece and heating a raw material was performed by using a reaction apparatus shown in FIG. 1

The experiment was performed by using an autoclave 1 (inner volume: about 27 cm$^3$) made of Inconel 625 and lined with platinum, having an inside dimension of a diameter of 15 mm and a length of 154 mm. The inner surface 2 of the autoclave 1 was thoroughly washed and dried. Also, a platinum-made wire used for supporting a test piece, a platinum-made growth frame 6, a platinum-made baffle plate 5 and a platinum mesh-made raw material cage were washed and dried in the same manner.

A polycrystalline GaN particle was used as the raw material 8 for nitride crystal growth. The polycrystalline GaN particle was washed with a hydrofluoric acid having a concentration of about 50 wt % so as to remove an attached matter, then thoroughly rinsed with pure water, dried, weighed 12.98 g and packed in the platinum mesh-made raw material cage.

A thoroughly dried ammonium chloride reagent as a mineralizer was weighed 0.74 g and packed together with the polycrystalline GaN raw material in the platinum mesh-made raw material cage, and the cage was disposed as a raw material 8 in the raw material region at the lower part of the autoclave.

Subsequently, a platinum-made baffle plate 5 (opening ratio: 10%) was disposed at the position substantially halving the autoclave into the lower raw material dissolution region and the upper crystal growth region.

Finally, the seed crystal and a plate-like tungsten (5 mm×5 mm×2 mm) as the test piece were hung by a platinum wire with a diameter of 0.2 mm in the platinum-made supporting frame and disposed such that the center of the seed crystal was located 25 mm down from the top end of the crystal growth region in the upper part of the autoclave and the center of the tungsten metal was located 40 mm down from the top end of the crystal growth region in the upper part of the autoclave, and the autoclave lid attached with a valve was swiftly closed, and the autoclave was weighed.

A conduit pipe was operated to communicate with a vacuum pump 11 through a valve 10 attached to the autoclave 10 and after performing vacuum degassing by opening the valve 10, the autoclave was cooled with a dry ice-methanol solvent while keeping the vacuum state. Then, the valve 10 was once closed.

Subsequently, the conduit pipe was operated to communicate with an ammonia bottle 12 and by again opening the valve 10, the autoclave 1 was filled with ammonia by keeping it from exposure to the outside air. Thereafter, since the line was automatically closed and the filling was stopped based on the control of flow rate after filling with 17.5 liter of ammonia at a flow rate of 2 liter/min, the valve 10 was closed. The amount of ammonia charged was confirmed to be 12.17 g by measuring the change in weight between before and after charging of ammonia.

Subsequently, the autoclave 1 was placed in an electric furnace constructed of a heater halved into the top and the bottom. The outer wall temperature of the autoclave was set such that the solution temperature in the lower part of the autoclave became 540° C. and the solution temperature in the upper part became 420° C. by raising the temperature over 12 hours, and the system was further held at these temperatures for 96 hours.

The relationship between the outer wall temperature of the autoclave and the temperature of the solution inside the autoclave was previously determined by actual measurement to prepare a correlation equation. The pressure in the autoclave 1 was about 130 MPa. Also, the variation of the controlled temperature during holding was ±5° C. or less.

After the completion of heating, the temperature was lowered in about 8 hours by using a program controller until the outer surface temperature in the lower part of the autoclave 1 became 150° C. Then, heating by a heater was stopped, and the system was allowed to naturally cool in the electric furnace. After confirming that the outer surface temperature in the lower part of the autoclave 1 was lowered to almost room temperature, first, the valve attached to the autoclave was opened to remove ammonia in the autoclave 1.

Next, ammonia in the autoclave 1 was completely removed by a vacuum pump. Thereafter, the autoclave lid was opened, and the supporting frame, baffle plate and raw material cage were taken out of the autoclave. Growth of a GaN single crystal was observed on the seed crystal.

Subsequently, the test piece was subjected to the following measurements and evaluations, and the results are shown together in Table 1 (the same applies to Examples 2 to 4 and Comparative Examples 1 to 5 below).

1) Presence or Absence of Attachment of GaN Crystal

The surface of the test piece after implementing Example 1 was observed with an eye and a cross-sectional analysis by an electron beam microanalyzer (EPMA) (Electron Probe Microanalyzer JXA-8200, manufactured by JEOL Ltd.), and the presence or absence of attachment of a GaN crystal was evaluated on the following two-grade scale.

A: Attachment of a GaN crystal was not observed.
B: Attachment of a GaN crystal was observed.

2) Measurement of Surface Unevenness

Unevenness of the cross-section of the test piece after implementing Example 1 was examined by a scanning electron microscope (SEM) (Analysis Scanning Electron Microscope JSM-6060A, manufactured by JEOL Ltd.) and evaluated on the following three-grade scale.

A: Almost no unevenness was observed.
B: Unevenness was slightly observed.
C: Large unevenness was observed.

3) Evaluation of Corrosion Condition

For confirming the corrosion condition of the test piece after implementing Example 1, the cross-section of the test piece was analyzed by an electron beam microanalyzer (EPMA) (Electron Probe Microanalyzer JXA-8200, manufactured by JEOL Ltd.) and evaluated on the following two-grade scale.

A: Corrosion of the test piece was not observed.

B: Corrosion of the test piece was observed, and it was confirmed that a metal element constituting the test piece was dissolved out.

The appearance of the test piece after implementing Example 1 was substantially unchanged from that before implementation, and an attached matter was also not observed. Even in the measurement by EPMA, production of a GaN crystal was not observed on the surface. When the surface unevenness of the test piece was examined by cross-sectional SEM, slight unevenness was observed, but the unevenness was apparently small as compared with cross-sectional SEM of a tungsten test piece of Comparative Example 5.

In this connection, a test piece (5 mm×5 mm×2 mm) equivalent to the test piece of Comparative Example 5 was measured before experiment by using a contact-type surface roughness measuring apparatus (Surfcom 130A, manufactured by Tokyo Seimitsu Co., Ltd.), as a result, the surface roughness (Ra) was 1.806 µm. This reveals that the surface roughness (Ra) of the test piece of Example 1 is smaller than 1.80 µm. When the cross-section was examined by EPMA, a nitride layer or other altered layers were not observed on the surface of the test piece and no corrosion was confirmed.

Figure 3:
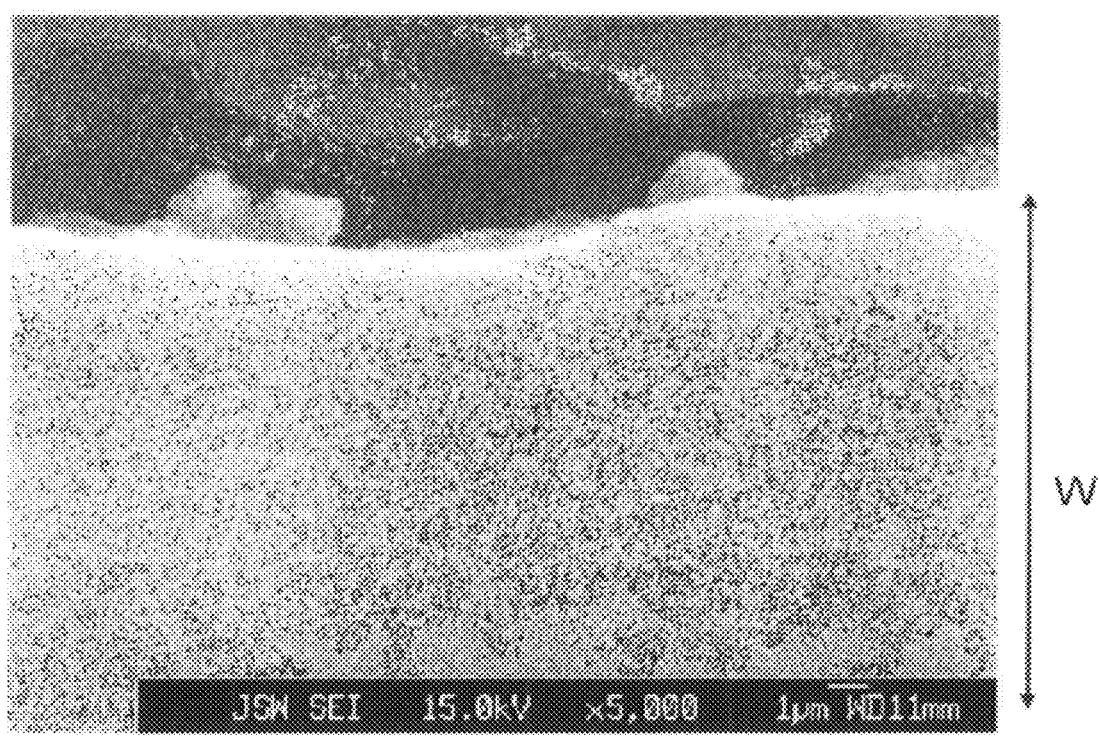
FIG. 3 is a cross-sectional SEM photograph (5,000 times) of the test piece after implementing Example 1.

FIG. 3 shows a cross-sectional SEM photograph (5,000 times) of the test piece after implementing Example 1. The surface roughness (Ra) was calculated by using this cross-sectional SEM photograph, as a result, the surface roughness (Ra) was presumed to be 0.56 µm. Incidentally, the method for calculating the surface roughness (Ra) by using the cross-sectional SEM photograph is as follows.

A portion corresponding to the reference length (L) in the average line direction is extracted from the roughness curve, and by taking the X axis on the average line direction of the extracted portion and taking the Y axis on the direction perpendicular to the average line, with the assumption that the roughness curve is represented by y=f(x), the value obtained according to the following formula and expressed by the unit of µm is taken as the surface roughness (Ra).

$$Ra = 1/L * \int_0^L |f(x)| dx \quad \text{[Math. 1]}$$

Calculation of the surface roughness (Ra) from the SEM photograph (FIG. 3) of Example 1 is described as an example. Here, for the sake of simplicity, the vertical direction of the cross-sectional SEM photograph of FIG. 3 is taken as the X axis direction, the longitudinal direction is taken as the Y axis direction, and the width in the photograph is taken as the reference length (L). A straight line parallel to the X axis direction was set, and the height to the surface of the tungsten test piece was measured by a scale every 0.5 µm width (50 points).

The average value (corresponding to the average line) of these measured values was calculated and after taking the absolute value of the difference between each measurement data and the average value, Ra was calculated by dividing the total of the absolute values by the reference length (L) and found to be 0.56 µm.

Example 2

In Example 2, a block-like Ta-2.5 wt % W alloy was used as the test piece. An experiment was performed under the same conditions as in Example 1 except for not hanging the seed crystal.

The appearance of the test piece after implementing Example 2 was observed and found to be substantially unchanged from that before implementation, and an attached matter was also not observed. Even in the measurement by EPMA, production of GaN was not observed on the surface. When the unevenness of the test piece was examined by cross-sectional SEM, almost no unevenness was confirmed.

The surface roughness of a test piece equivalent to the test piece of Example 2 was measured before hanging experiment, as a result, the surface roughness (Ra) was 0.463 µm. When the cross-section was examined by EPMA, a nitride layer or other altered layers were not observed on the surface of the test piece, and no corrosion was confirmed.

Example 3

In Example 3, a plate-like tantalum was used as the test piece. An experiment was performed under the same conditions as in Example 1 except for not hanging the seed crystal.

The appearance of the test piece after implementing Example 3 was observed and found to be substantially unchanged from that before implementation, and an attached matter was also not observed. Even in the measurement by EPMA, production of GaN was not observed on the surface. When the unevenness of the test piece was examined by cross-sectional SEM, the cross-section was confirmed to be very flat.

The surface roughness of a test piece equivalent to the test piece of Example 3 was measured before hanging experiment, as a result, the surface roughness (Ra) was 0.079 µm. When the cross-section was examined by EPMA, a nitride layer or other altered layers were not observed on the surface of the test piece, and no corrosion was confirmed.

Example 4

In Example 4, a columnar titanium was used as the test piece. An experiment was performed under the same conditions as in Example 1 except for not hanging the seed crystal.

The appearance of the test piece after implementing Example 4 was observed and found to be substantially unchanged from that before implementation, and an attached matter was also not observed. Even in the measurement by EPMA, production of GaN was not observed on the surface. When the unevenness of the test piece was examined by cross-sectional SEM, the cross-section was curved because of a columnar test piece but was confirmed to be very flat.

The test piece of Example 4 was in a columnar shape with φ2 mm and could be hardly measured for the surface roughness, and therefore, the surface roughness (Ra) was not measured, but cross-sectional observation by SEM revealed that the surface roughness was in the same level as those of Examples 2 and 3. When the cross-section was examined by EPMA, a nitride layer or other altered layers were not observed on the surface of the test piece, and no corrosion was confirmed.

Comparative Example 1

In Comparative Example 1, a plate-like ruthenium was used as the test piece. An experiment was performed under the same conditions as in Example 1 except for not hanging the seed crystal.

The appearance of the test piece after implementing Comparative Example 1 was examined, as a result, an attached matter was observed on the surface. Measurement by EPMA confirmed that the surface attached matter was mainly composed of Ga and N and thus, GaN was produced. When the unevenness of the test piece was examined by cross-sectional SEM, large unevenness was not observed, but unevenness in the micron order was confirmed.

Measurement of the surface roughness was not performed, but cross-sectional observation by SEM revealed that the surface roughness was in the same level as those of Examples 2 and 3. When the cross-section was examined by EPMA, a cavity considered to be a crystal grain boundary of ruthenium was observed, but a nitride layer or other altered layers were not observed on the surface of the test piece, and no corrosion was confirmed.

Comparative Example 2

In Comparative Example 2, a plate-like Pt-20 wt % Ir alloy was used as the test piece. An experiment was performed under the same conditions as in Example 1 except for not hanging the seed crystal.

The appearance of the test piece after implementing Comparative Example 2 was examined, as a result, an attached matter was observed on the surface. Measurement by EPMA confirmed that the surface attached matter was mainly composed of Ga and N and thus, GaN was produced.

The unevenness of the test piece was examined by cross-sectional SEM, as a result, the cross-section was confirmed to be very flat. When the surface roughness of a test piece equivalent to the test piece of Comparative Example 2 was measured before hanging experiment, the surface roughness (Ra) was 0.059 µm. The cross-section was examined by EPMA, as a result, a nitride layer or other altered layers were not observed on the surface of the test piece, and no corrosion was confirmed.

Comparative Example 3

In Comparative Example 3, a block-like Rene 41 was used as the test piece. An experiment was performed under the same conditions as in Example 1 except for not hanging the seed crystal.

The appearance of the test piece after implementing Comparative Example 3 was examined, as a result, loss of metallic luster and change to black were confirmed. Since the surface was altered and the decrease in weight was large, it is apparent that there is a problem in the corrosion resistance. Therefore, evaluations of attached matter and surface unevenness were not particularly performed.

The cross-section was examined by EPMA so as to verify the degree of corrosion, as a result, a corroded and altered layer was formed down to a depth of about 80 µm from the surface of the test piece, and in the corroded and altered layer, conspicuous eluting of Fe, Ni and Co was observed.

Comparative Example 4

In Comparative Example 4, a block-like Inconel 625 was used as the test piece. An experiment was performed under the same conditions as in Example 1 except for not hanging the seed crystal.

The appearance of the test piece after implementing Comparative Example 4 was examined, as a result, loss of metallic luster and change to black were confirmed. Since the surface was altered and the decrease in weight was large, it is apparent that there is a problem in the corrosion resistance. Therefore, evaluations of attached matter and surface unevenness were not particularly performed.

The cross-section was examined by EPMA so as to verify the degree of corrosion, as a result, a corroded and altered layer was formed down to a depth of about 70 µm from the surface of the test piece, and in the corroded and altered layer, conspicuous eluting of Fe, Ni and Cr was observed.

Comparative Example 5

In Comparative Example 5, a plate-like tungsten was used as the test piece. A test piece using the same material as in Example 1 but differing in the surface roughness was used. An experiment was performed under the same conditions as in Example 1 except for not hanging the seed crystal.

The surface roughness of a test piece equivalent to the test piece of Comparative Example 5 was measured before hanging experiment, as a result, the surface roughness (Ra) was 1.806 µm. When the appearance of the test piece after implementing Comparative Example 5 was examined, an attached matter was observed on the surface.

Measurement by EPMA confirmed that the surface attached matter was mainly composed of Ga and N and thus, GaN was produced. The unevenness of the test piece was examined by cross-sectional SEM, as a result, large unevenness was confirmed. When the cross-section was examined by EPMA, GaN was attached to the surface, but a nitride layer or other altered layers were not recognized on the surface of the test piece, and no corrosion was confirmed.

Figure 4:
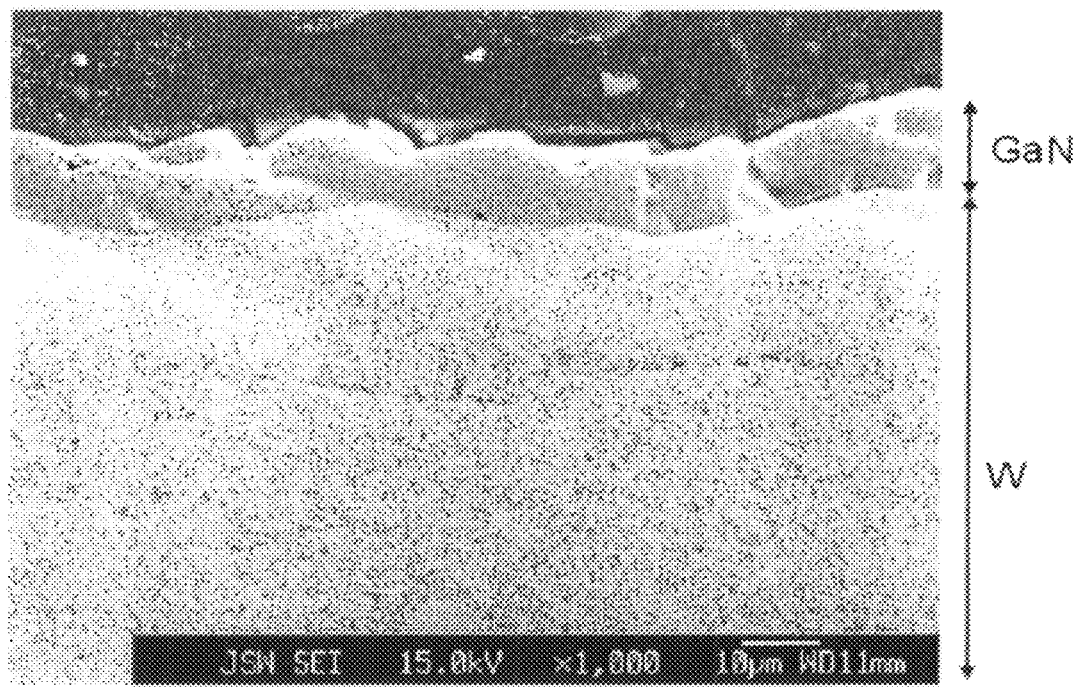
FIG. 4 is a cross-sectional SEM photograph (1,000 times) of the test piece after implementing Comparative Example 5.

FIG. 4 shows a cross-sectional SEM photograph (1,000 times) of the test piece after implementing Comparative Example 5.

TABLE 1

| | Details of Test Piece | | | Evaluation Results of Test Piece | | | |
|---|---|---|---|---|---|---|---|
| | | | | GaN | Surface | | Change of Test Piece |
| Distinction | Metal•Alloy | Shape (mm) | Disposed Position | Attachment | Unevenness | Corrosion | (EPMA analysis) |
| Example 1 | W | plate (5 * 5 * 2) | crystal precipitation part | A | B | A | No corrosion |
| Example 2 | Ta-2.5 wt % W | block (5 * 5 * 5) | crystal precipitation part | A | A | A | No corrosion |
| Example 3 | Ta | plate (5 * 5 * 2) | crystal precipitation part | A | A | A | No corrosion |
| Example 4 | Ti | column (ø2 * 10) | crystal precipitation part | A | A | A | No corrosion |
| Comparative Example 1 | Ru | plate (20 * 5 * 1) | crystal precipitation part | B | A | A | No corrosion; GaN was precipitated on surface. |
| Comparative Example 2 | Pt-20 wt % Ir | plate (20 * 5 * 0.5) | crystal precipitation part | B | A | A | No corrosion; GaN was precipitated on surface. |
| Comparative Example 3 | Rene 41 | block (5 * 5 * 5) | crystal precipitation part | — | — | B | Corrosion occurred; elution of Fe, Ni and Co was confirmed. |
| Comparative | Alloy 625 | block (5 * 5 * 5) | crystal precipitation part | — | — | B | Corrosion occurred; elution of |

TABLE 1-continued

| | Details of Test Piece | | | Evaluation Results of Test Piece | | | |
|---|---|---|---|---|---|---|---|
| | | | | GaN | Surface | | Change of Test Piece |
| Distinction | Metal•Alloy | Shape (mm) | Disposed Position | Attachment | Unevenness | Corrosion | (EPMA analysis) |
| Example 4 Comparative Example 5 | W | plate (5 * 5 * 2) | crystal precipitation part | B | C | A | Fe, Ni and Cr was confirmed. No corrosion; GaN was precipitated on surface. |

As shown in Examples 1 to 4 of Table 1, it was confirmed that when tungsten, Ta-2.5 wt % W, tantalum or titanium is used as the material of the test piece and at the same time, the surface roughness of the test piece is small, GaN is not attached to the surface.

On the other hand, as shown in Comparative Example 5, even when the same tungsten is used as the material of the test piece, if the surface roughness of the test piece is large, attachment of GaN was observed on the surface.

These results reveal that attachment of GaN can be suppressed by the combination of the kind of the material constituting a member used for the production of a nitride crystal by an ammonothermal method and the surface roughness of the material.

Also, in Comparative Examples 1 and 2, ruthenium or Pt-20 wt % Ir was used as the material of the test piece, but attachment of GaN was observed on the surface. These materials have corrosion resistance and are usable as an anticorrosive lining material but in view of GaN attachment, are not an optimal material as the material constituting a member used for the production of a nitride crystal by an ammonothermal method, because despite a small surface roughness, the amount of GaN attached is large.

In Comparative Examples 3 and 4, Rene 41 or Inconel 625 was used as the material of the test piece, and it was confirmed that corrosion seriously proceeds therein and in view of corrosion resistance, these materials cannot be used as the material constituting a member used for the production of a nitride crystal by an ammonothermal method.

From these results, it was verified that attachment of GaN to the material surface can be suppressed by using a specific material according to the present invention.

When the same experiment as in Examples 2 to 4 is performed by arranging a seed crystal to be present in the crystal growth region similarly to Example 1, it is confirmed that a GaN single crystal grows on the seed crystal. At this time, it is revealed that growth of a GaN single crystal on the seed crystal is not inhibited by the presence of a metal or alloy containing one or more atoms selected from the group consisting of Ta, W and Ti. The seed crystal can be fixed on the test piece used in Examples 1 to 4 and then disposed in the vessel, and it is confirmed that also in this case, a GaN single crystal grows.

While the invention has been described in detail and with reference to specific embodiments thereof, it will be apparent to one skilled in the art that various changes and modifications can be made therein without departing from the spirit and scope of the invention. This application is based on Japanese Patent Application (Patent Application No. 2009-269777) filed on Nov. 27, 2009, the entirety of which is incorporated herein by way of reference.

INDUSTRIAL APPLICABILITY

The present invention is useful for the growth of a bulk single crystal of nitride containing an element of Group III of the periodic table, among others, a bulk single crystal of GaN. In particular, a nitride crystal can be obtained by efficiently utilizing the raw material. Furthermore, labors such as washing for making it possible to reutilize the vessel can be saved, so that a great improvement can be expected from both aspects of time and cost. Accordingly, the present invention has very high industrial applicability.

DESCRIPTION OF REFERENCE NUMERALS AND SIGNS

1 Autoclave
2 Inner surface of autoclave
3 Lining
4 Inner surface of lining
5 Baffle plate
6 Growth frame
7 Seed crystal
8 Raw material
10 Valve
11 Vacuum pump
12 Ammonia bottle
13 Nitrogen bottle
14 Mass flow meter
20 Inner cylinder
21 Inner surface of inner cylinder

The invention claimed is:

1. A method for producing a nitride crystal, the method comprising:
    charging a raw material of the nitride crystal and a mineralizer to a raw material dissolution region of a vessel;
    placing a baffle plate having open pores in the vessel such that the vessel is divided into two regions consisting of the raw material dissolution region and a crystal growth region;
    placing a seed crystal in the crystal growth region;
    closing the vessel with an airtight seal;
    charging the closed vessel with ammonia;
    heating the sealed vessel to a temperature to form a solution of the mineralizer in ammonia;
    growing the nitride crystal on the seed crystal in a subcritical or supercritical state;
    wherein at least one of a surface portion of the vessel and a member provided in the vessel contacting the solution of the mineralizer in ammonia comprises a metal or alloy having one or more selected from the group consisting of tantalum (Ta), tungsten (W) and titanium (Ti), and a surface roughness (Ra) of the surface portion contacting the saturated mineralizer solution is less than 1.80 μm.

2. The method for producing a nitride crystal as claimed in claim 1, wherein the surface portion of the vessel comprising the metal or alloy having one or more selected from the group consisting of Ta, W and Ti is at least a part of the crystal growth region of the vessel.

3. The method for producing a nitride crystal as claimed in claim 2, wherein 20% or more of the area of the surface of the crystal growth region comprises the metal or alloy.

4. The method for producing a nitride crystal as claimed in claim 1, wherein the surface of a member provided in the vessel comprises the metal or alloy.

5. The method for producing a nitride crystal as claimed in claim 4, wherein the member comprising the metal or alloy is disposed in the crystal growth region of the vessel.

6. The method for producing a nitride crystal as claimed in claim 1, further comprising removal of oxygen from the vessel.

7. The method for producing a nitride crystal as claimed in claim 1, wherein
- the vessel is an inner cylinder disposed in an autoclave,
- a space between the cylinder and an inner wall of the autoclave is free of oxygen, and
- the nitride crystal is produced in the inner cylinder.

* * * * *